US009972393B1

(12) United States Patent
Segal (10) Patent No.: US 9,972,393 B1
(45) Date of Patent: May 15, 2018

(54) ACCELERATING PROGRAMMING OF A FLASH MEMORY MODULE

(71) Applicant: AVAGO TECHNOLOGIES GENERAL IP (SINGAPORE) PTE. LTD., Yishun (SG)

(72) Inventor: Avigdor Segal, Netanya (IL)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 326 days.

(21) Appl. No.: 14/323,889

(22) Filed: Jul. 3, 2014

(51) Int. Cl.
| | |
|---|---|
| *G06F 12/08* | (2016.01) |
| *G11C 16/10* | (2006.01) |
| *G06F 12/0811* | (2016.01) |
| *G06F 3/06* | (2006.01) |

(52) U.S. Cl.
CPC ............ *G11C 16/105* (2013.01); *G06F 3/065* (2013.01); *G06F 3/0619* (2013.01); *G06F 3/0679* (2013.01); *G06F 12/08* (2013.01); *G06F 12/0811* (2013.01)

(58) Field of Classification Search
CPC ...................................................... G06F 12/08
USPC ........................................................ 711/103
See application file for complete search history.

(56) References Cited

U.S. PATENT DOCUMENTS

| | | | |
|---|---|---|---|
| 4,430,701 A | 2/1984 | Christian et al. | |
| 4,463,375 A | 7/1984 | Macovski | |
| 4,584,686 A | 4/1986 | Fritze | |
| 4,589,084 A | 5/1986 | Fling et al. | |
| 4,777,589 A | 10/1988 | Boettner et al. | |
| 4,866,716 A | 9/1989 | Weng | |
| 5,003,597 A | 3/1991 | Merkle | |
| 5,077,737 A | 12/1991 | Leger et al. | |
| 5,297,153 A | 3/1994 | Baggen et al. | |
| 5,305,276 A | 4/1994 | Uenoyama | |
| 5,592,641 A | 1/1997 | Doyle et al. | |

(Continued)

FOREIGN PATENT DOCUMENTS

WO    WO2009053963 A2    4/2009

OTHER PUBLICATIONS

Search Report of PCT Patent Application WO 2009/118720 A3, dated Mar. 4, 2010.

(Continued)

*Primary Examiner* — Tuan Thai
*Assistant Examiner* — Gautam Sain
(74) *Attorney, Agent, or Firm* — Sheridan Ross P.C.

(57) ABSTRACT

According to an embodiment of the invention there is provided a method for accelerating programming of data, the method may include receiving multiple input data units that were sent from a host computer; wherein the input data units may include first and second input data units; first level programming the first input data units to cache memory pages and first level programming the second input data units to first level target memory pages; and applying a copy back operation that comprises retrieving the first input data units from the cache memory pages and second level programming the first input data units to second level target memory pages; wherein any target page out of the first level target pages and the second level target pages differs from a cache memory page; and wherein the first level programming is faster than the second level programming.

20 Claims, 5 Drawing Sheets

(56) References Cited

U.S. PATENT DOCUMENTS

| | | |
|---|---|---|
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Bryg |
| 5,729,490 A | 3/1998 | Calligaro et al. |
| 5,740,395 A | 4/1998 | Hasbun |
| 5,745,418 A | 4/1998 | Hu et al. |
| 5,778,430 A | 7/1998 | Giovannetti |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,228,728 B1 * | 7/2012 | Yang .................. G11C 11/5628 365/185.03 |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 2001/0034815 A1 | 10/2001 | Dugan et al. |
| 2002/0063774 A1 | 5/2002 | Hillis et al. |
| 2002/0085419 A1 | 7/2002 | Choi |
| 2002/0154769 A1 | 10/2002 | Petersen et al. |
| 2002/0156988 A1 | 10/2002 | Sekibe |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Jeong |
| 2003/0192007 A1 | 10/2003 | Miller et al. |
| 2004/0015771 A1 | 1/2004 | Lasser et al. |
| 2004/0030971 A1 | 2/2004 | Shibata |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Chevallier |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |

(56) References Cited

U.S. PATENT DOCUMENTS

| | | |
|---|---|---|
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0027961 A1 | 6/2009 | Park |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0017561 A1* | 1/2010 | Yang .................. G06F 13/4239 711/103 |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0174853 A1 | 7/2010 | Lee |
| 2010/0180073 A1 | 7/2010 | Weingarten et al. |
| 2010/0172179 A1 | 8/2010 | Gorobets et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0149881 A1 | 11/2010 | Lee et al. |
| 2010/0293321 A1 | 11/2010 | Weingarten |
| 2010/0318724 A1 | 12/2010 | Yeh |
| 2010/0332922 A1* | 12/2010 | Chang .................. G11C 5/143 714/704 |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |

(56) References Cited

U.S. PATENT DOCUMENTS

| | | |
|---|---|---|
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0221774 A1* | 8/2012 | Atkisson ............ G06F 12/0802 711/103 |
| 2012/0246391 A1 | 9/2012 | Meir |
| 2013/0132651 A1* | 5/2013 | Li ...................... G06F 12/0246 711/103 |
| 2013/0304966 A1* | 11/2013 | Joo .................... G06F 12/0246 711/103 |
| 2014/0029341 A1* | 1/2014 | In ...................... G06F 12/0246 365/185.12 |
| 2014/0208187 A1* | 7/2014 | Rho .................... G06F 11/1048 714/764 |

OTHER PUBLICATIONS

Search Report of PCT Patent Application WO 2009/095902 A3, dated Mar. 4, 2010.
Search Report of PCT Patent Application WO 2009/078006 A3, dated Mar. 4, 2010.
Search Report of PCT Patent Application WO 2009/074979 A3, dated Mar. 4, 2010.
Search Report of PCT Patent Application WO 2009/074978 A3, dated Mar. 4, 2010.
Search Report of PCT Patent Application WO 2009/072105 A3, dated Mar. 4, 2010.
Search Report of PCT Patent Application WO 2009/072104 A3, dated Mar. 4, 2010.
Search Report of PCT Patent Application WO 2009/072103 A3, dated Mar. 4, 2010.
Search Report of PCT Patent Application WO 2009/072102 A3, dated Mar. 4, 2010.
Search Report of PCT Patent Application WO 2009/072101 A3, dated Mar. 4, 2010.
Search Report of PCT Patent Application WO 2009/072100 A3, dated Mar. 4, 2010.
Search Report of PCT Patent Application WO 2009/053963 A3, dated Mar. 4, 2010.
Search Report of PCT Patent Application WO 2009/053962 A3, dated Mar. 4, 2010.
Search Report of PCT Patent Application WO 2009/053961 A3, dated Mar. 4, 2010.
Search Report of PCT Patent Application WO 2009/037697 A3, dated Mar. 4, 2010.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

ACCELERATING PROGRAMMING OF A FLASH MEMORY MODULE

BACKGROUND OF THE INVENTION

Multi level cells (MLC) flash memory cells may store multiple bits per cell. These multiple bits per cell may include a least significant bit (LSB), a most significant bit (MSB) and zero or more central significant bits (CSBs).

Bits of different order (also referred to as bits of different significance) are stored by programmings of different significance. MSB bits are programmed by MSB programming, LSB bits are programmed by LSB programming and each CSB bit is programmed by the appropriate CSB programming. Higher significance bit programming is faster than lower significance bit programming.

When performing MSB programming a host interface of a memory controller can slow down the programming process (form a bottleneck) while when performing LSB programming (which is slower than MSB programming) the flash memory module can slow down the programming process (form a bottleneck).

Figure 1:
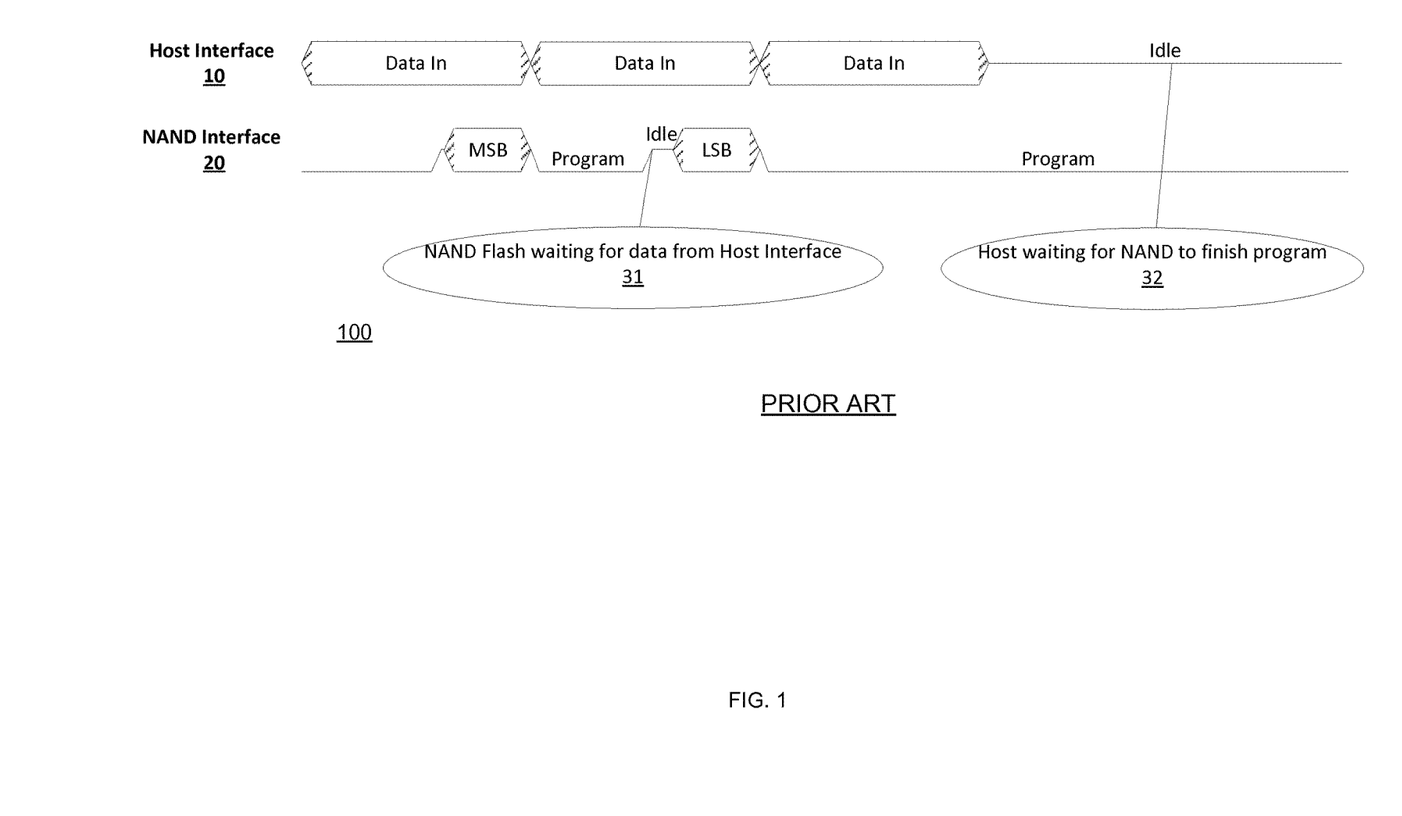
FIG. 1 is a prior art timing diagram.

FIG. 1 is a prior art timing diagram 100 that shows (a) data being written 10 by a host computer to a host interface of a memory controller, (b) data being written to a flash memory module from a flash memory module interface of a memory controller, (c) a first idle event 31 in which a flash memory module waits for data from a host computer and (d) a second idle event 32 in which the host computer is barred from sending more information—as the programming of data to a flash memory module did not end.

There is a growing need to increase the programming speed especially in devices where an internal volatile memory of a memory controller is not big enough to smooth (by buffering) the incoming data.

SUMMARY

According to an embodiment of the invention there may be provided a method, a non-transitory computer readable medium and a memory controller for acceleration of programming.

According to an embodiment of the invention there may be provided a method for accelerating programming of data, the method may include receiving multiple input data units that were sent from a host computer; wherein the input data units comprise first and second input data units; first level programming the first input data units to cache memory pages and first level programming the second input data units to first level target memory pages; and applying a copy back operation that retrieving the first input data units from the cache memory pages and second level programming the first input data units to second level target memory pages; wherein any target page out of the first level target pages and the second level target pages differs from a cache memory page; and wherein the first level programming may be faster than the second level programming.

The first level programming may be a most significant bit (MSB) programming.

The second level programming may be a least significant bit (LSB) programming.

The first level programming of the first and second input data units occur in parallel to each other.

The first level programming of the first and second input data units occur in a partially overlapping manner.

The method may include preventing programming of any input data unit after the input data unit is programmed to a target page.

The ratio between an overall number of dies performing Copy Back and an overall number of dies caching may exceed one.

The ratio between an overall number of dies performing Caching an overall size of dies performing Copy Back and may be a fraction of a ratio between programming speeds of the first level and second level programming.

The fraction may be one half.

The input data units may include third input data units; and the method may include first level programming the third input data units to additional cache memory pages; wherein the applying of the copy back operation may include retrieving the third input data units from the additional cache memory pages and third level programming the third input data units to third level target memory pages; and wherein the third level programming differs by speed from the first and second level programming.

According to an embodiment of the invention there may be provided method for accelerating programming of data, the method receiving multiple input data units by a memory controller and from a host computer; wherein the input data units first and second input data units; instructing a programming circuit of a flash memory module to perform first level programming the first input data units to cache memory pages of the flash memory module and to perform first level programming the second input data units to first level target memory pages of the flash memory module; and instructing a copy back circuit of the flash memory module to apply a copy back operation that retrieving the first input data units from the cache memory pages and second level programming the first input data units to second level target memory pages; wherein any target page out of the first level target pages and the second level target pages differs from a cache memory page; and wherein the first level programming may be faster than the second level programming. The method may include allocating cache memory pages and target pages.

The allocating may include responsive to programming speeds of the first level and second level programming.

The input data units may include third input data units; wherein the method may include first level programming the third input data units to additional cache memory pages; wherein the applying of the copy back operation may include retrieving the third input data units from the additional cache memory pages and third level programming the third input data units to third level target memory pages; and wherein the third level programming may differ by speed from the first and second level programming.

According to an embodiment of the invention there may be provided a non-transitory computer readable medium that stores instructions that once executed by a computer causes the computer to execute the stages of receiving multiple input data units that were sent from a host computer; wherein the input data units may include first and second input data units; first level programming the first input data units to cache memory pages and first level programming the second input data units to first level target memory pages; and applying a copy back operation that retrieving the first input data units from the cache memory pages and second level programming the first input data units to second level target memory pages; wherein any target page out of the first level target pages and the second level target pages may differ from a cache memory page; and wherein the first level programming may include faster than the second level programming.

According to an embodiment of the invention there may be provided a memory controller that may include a control unit and an interface; wherein the interface may be arranged to receive multiple input data units from a host computer; wherein the input data units may include first and second input data units; wherein the control unit may be arranged to instruct a programming circuit of a flash memory module to perform first level programming the first input data units to cache memory pages of the flash memory module and to perform first level programming of the second input data units to first level target memory pages of the flash memory module; and instruct a copy back circuit of the flash memory module to apply a copy back operation that retrieving the first input data units from the cache memory pages and second level programming the first input data units to second level target memory pages; wherein any target page out of the first level target pages and the second level target pages differs from a cache memory page; and wherein the first level programming may be faster than the second level programming.

According to an embodiment of the invention there may be provided a flash memory module that may include an interface, a copy back circuit, a programming circuit and a flash memory pages; wherein the interface may be arranged to receive multiple input data units from a memory controller; wherein the input data units may include first and second input data units; wherein the programming circuit may be arranged to perform first level programming the first input data units to cache memory pages of the flash memory module and to perform first level programming of the second input data units to first level target memory pages of the flash memory module; and wherein the copy back circuit may be arranged to apply a copy back operation that may include retrieving the first input data units from the cache memory pages and second level programming the first input data units to second level target memory pages; wherein any target page out of the first level target pages and the second level target pages may differ from a cache memory page; and wherein the first level programming may include faster than the second level programming.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Figure 2:
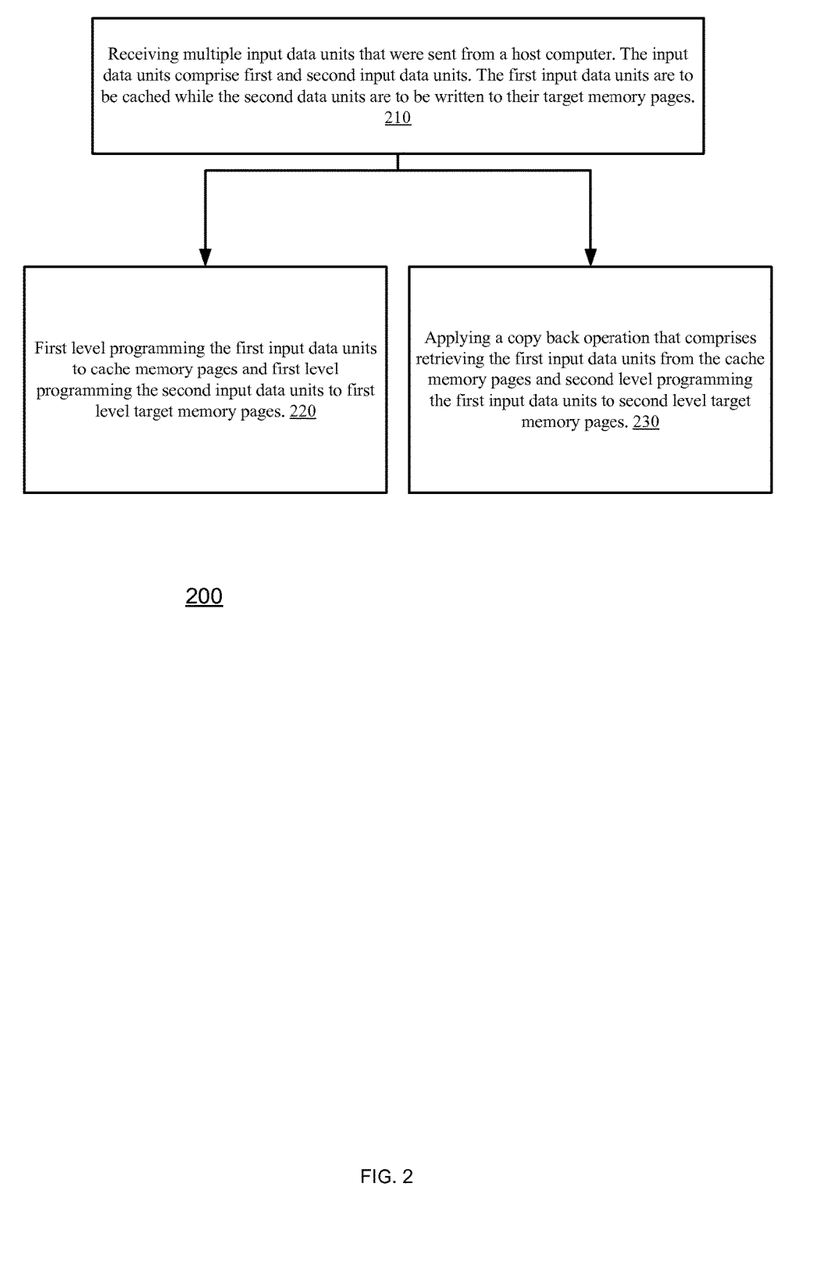
FIG. 2 illustrates a method according to an embodiment of the invention.

FIG. 2 illustrates method 200 according to an embodiment of the invention.

Method 200 is executed by a flash memory module that may be coupled to a memory controller that in turn is coupled to a host computer.

Method 200 may start by stage 210 of receiving multiple input data units that were sent from a host computer. The input data units comprise first and second input data units. The first input data units are to be cached while the second data units are to be written to their target memory pages.

Stage 210 may be followed by stages 220 and 230.

Stage 220 may include first level programming the first input data units to cache memory pages and first level programming the second input data units to first level target memory pages.

Stage 230 may include applying a copy back operation that comprises retrieving the first input data units from the cache memory pages and second level programming the first input data units to second level target memory pages.

Any target page out of the first level target pages and the second level target pages differ from a cache memory page.

The first level programming is faster than the second level programming. Cache memory pages may be SLC mode pages within MSB device.

The first level programming may be a most significant bit (MSB) programming. The second level programming may be a least significant bit (LSB) programming.

It is noted that the first and second level programming may be selected from a group of different bit significance programming that may include MSB programming, LSB programming and at least one CSB programming.

The first level programming of the first and second input data units may occur in parallel to each other, in a partially of fully overlapping manner.

Programming data to a target page may mean that the data is not further programming to another page. Thus, the method may include preventing further programming of any input data unit after the input data unit is programmed to a target page. Alternatively, further programming of the data may be performed during memory management operations such as cleaning or merging.

The ratio between an overall size (or overall number) of caching dies and an overall size (or overall number) of target dies may exceed one, may equal one or may be lower than one.

The ratio between an overall size (or overall number) of target dies an overall size (or overall number) of caching dies may be related to (for example may be a fraction of) a ratio between programming speeds of the first level and second level programming. The optimal ratio shall equalize the performance of caching process and copy-back process.

The fraction may be equal to the ratio between programming speeds of caching and copy-back. Meaning faster process will need less dies for operation and wise versa. In case part of the pages are programmed directly without caching first, ration would be one half, one third and the like, according to directly programmed fraction of the overall pages The method may be applied mutatis mutandis to more than two programming levels. For example, the input data units further comprise third input data units; and the method may include first level programming the third input data units to additional cache memory pages. The applying of the copy back operation may also include retrieving the third input data units from the additional cache memory pages and third level programming the third input data units to third level target memory pages. The third level programming differs by speed from the first and second level programming.

Figure 3:
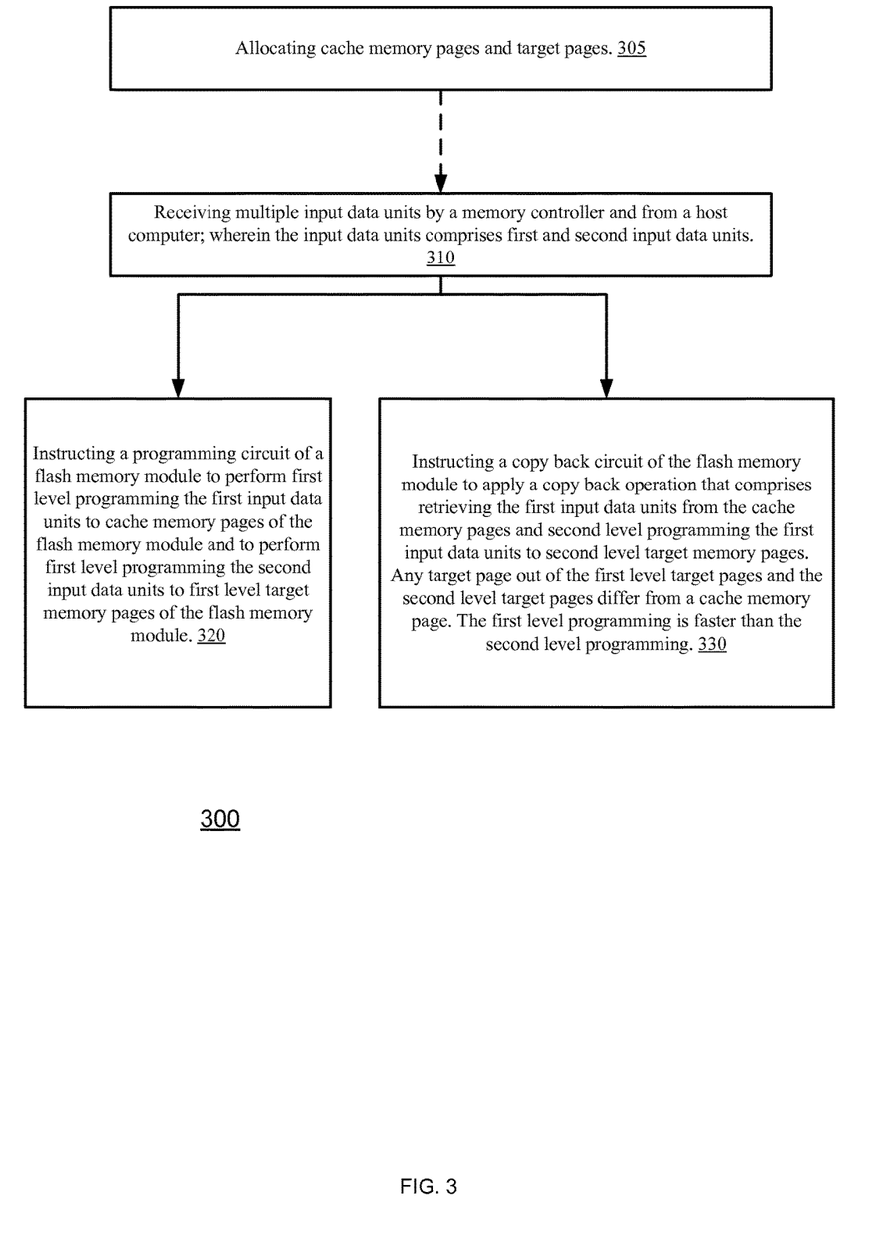
FIG. 3 illustrates a method according to an embodiment of the invention.

FIG. 3 illustrates method 300 according to an embodiment of the invention.

Method 300 is executed by a memory controller that is coupled to a host computer and to a flash memory module.

Method 300 may start by stage 310 of receiving multiple input data units by a memory controller and from a host computer; wherein the input data units comprises first and second input data units.

Stage 310 may be followed by stages 320 and 330.

Stage 320 may include instructing a programming circuit of a flash memory module to perform first level programming the first input data units to cache memory pages of the flash memory module and to perform first level programming the second input data units to first level target memory pages of the flash memory module.

Stage 330 may include instructing a copy back circuit of the flash memory module to apply a copy back operation that comprises retrieving the first input data units from the cache memory pages and second level programming the first input data units to the second level target memory pages. Any target page out of the first level target pages and the second level target pages differ from a cache memory page. The first level programming is faster than the second level programming.

Method 300 may also include stage 305 of allocating cache memory pages and target pages, and may include allocating dies for caching process and for copy-back process.

The allocating of dies may be responsive to programming speeds of the first level and second level programming.

The allocating can include allocating memory dies for caching process and dies for copy back process so that the ratio between an overall size (or overall number) of cache memory dies and an overall size (or overall number) of copy back dies may exceed one, may equal one or may be lower than one.

The allocating can include allocating cache memory dies and dies for copy back so that the ratio between an overall size (or overall number) of copy back dies an overall size (or overall number) of caching memory dies may be a fraction of a ratio between programming speeds of the first level and second level programming.

If first level programming is done directly, while second level is done via copy back process, the fraction may be one half, one third, and the like.

The method may be applied mutatis mutandis to more than two programming levels. For example, the input data units may include third input data units. The method may include instructing the programming circuit of the flash memory module to perform third level programming the third input data units to additional cache memory pages. The applying of the copy back operation further comprises retrieving the third input data units from the additional cache memory pages and third level programming the third input data units to third level target memory pages. The third level programming differs by speed from the first and second level programming.

In order to balance and optimize Caching and Copy Back stages need to get near the same performance.

Using ratio between MSB and LSB page program bandwidth (or speed) BW (single die):

$$\frac{MSB_{BW}}{LSB_{BW}} = \rho$$

Assuming that caching and MSB programming have similar performance, and assuming that caching group of dies perform both caching of data designated to second level and first level direct programming. Thus caching process process twice more data than Cony Back process. Caching to Copy Back ratio then (single die):

$$\frac{MSB_{BW}}{(2 \cdot LSB_{BW})} = 1/2\rho$$

Optimal balancing would be L/M≈½ρ, where L-number of dies performing Copy-Back (toward LSB), and M-number of dies performing Caching (toward MSB).

Other ratios (other than ½) can be applied.

Average write BW is given by:

$$\text{Absolute Average Write } BW = \frac{\text{Total data written}}{\text{Total time it took}} =$$

-continued $$\frac{\text{Data Written to } MSB + \text{Data Written to } LSB}{\text{Time took to write } MSB + \text{Time took to write } LSB} =$$

$$\frac{\text{Data Written to } MSB + \text{Data Written to } LSB}{\frac{\text{Data Written to } MSB}{\text{Write } BW \ MSB} + \frac{\text{Data Written to } LSB}{\text{Write } BW \ LSB}} \xrightarrow{\text{Assuming same amount of data we get}}$$

$$\frac{2}{\frac{1}{\text{Write } BW \ MSB} + \frac{1}{\text{Write } BW \ LSB}} =$$

$$2((\text{Write } BW \ MSB)^{-1} + (\text{Write } BW \ LSB)^{-1})^{-1}$$

Performance of prior art device: Average Write BW=2((Effective Write BW MSB)$^{-1}$+(Effective Write BW LSB)$^{-1}$)$^{-1}$ Where Effective Write BW=Max (Write BW, Host Interface BW)=Max (Write BW, α) due to Host interface as bottleneck.

Total MSB pages write BW is higher than LSB→Write BW MSB>Write BW LSB

Total MSB pages write BW is higher than Host interface speed→Write BW MSB>α→Effective Write BW MSB=α

Total LSB pages write BW is lower than Host interface speed→Write BW LSB<α→Effective Write BW LSB=Write BW LSB Thus: Average Write BW=2((α)$^{-1}$+(Write BW LSB)$^{-1}$)$^{-1}$ Performance when practicing a method according to an embodiment of the invention:

The flash memory module is virtually divided to two groups:

a. N—number of dies performing Caching to SLC and MSB;

b. M—number of dies performing Copy-back operations.

Data in and Caching BW given by Effective Cache In BW=2((Effective Write BW MSB(N dies))$^{1}$+(Effective Write BW SLC(N dies))$^{-1}$)$^{-1}$ Assuming that the number N was chosen in such manner that Caching performance is near Host interface we can assume that Effective equal to caching: Effective Cache In BW=2((N·Write BW MSB)$^{-1}$+(N·Write BW SLC)$^{-1}$)$^{-1}$ Copy Back BW is given by M·Copy Back BW LSB Total performance is given by the bottleneck of those two processes: Write BW=Min(Effective Cache In BW, M·Copy Back BW LSB)

Example:

| Variable | Symbol | Value | Units |
|---|---|---|---|
| Host I/F BW | HBW | 100 | [MB/s] |
| NAND I/F BW | NBW | 300 | [MB/s] |
| Program Speed SLC | γ | 50 | [us] |
| MSB | α | 50 | [us] |
| LSB | β | 8⅓ | [us] |
| Number of dies Total | | 8 | |
| Caching | N | 2 | |
| Copy-Back | M | 6 | |

Host Interface BW=100 MB/s

Average NAND die Write BW=2(α$^{-1}$+β$^{-1}$)$^{-1}$=2(50$^{-1}$+8⅓$^{-1}$)$^{-1}$=14.3 MB/s If there will be no Host Interface bottleneck:

Average Array Write BW=(N+M)·Average NAND die Write BW=114.3 MB/s

Host Interface bottleneck cause $$\text{Actual Write } BW =$$
$$2((\text{MIN}(HBW, (N+M)\alpha))^{-1} + (\text{MIN}(HBW, (N+M)\beta))^{-1})^{-1} =$$
$$2(100^{-1} + 662/3^{-1})^{-1} = 80 \text{ MB/s}$$

Invention Write BW=MIN (Caching, Copy_Back)=MIN (MIN (HBW, N·α),2·M·β)=MIN (MIN (100,2·50), 2·6·8⅓)=100 MB/s Accordingly—the appliance of methods 200 and/or 300 resulted in a full Host Interface BW utilization and a gain of 25% in comparison to the prior art performance.

Figure 4:
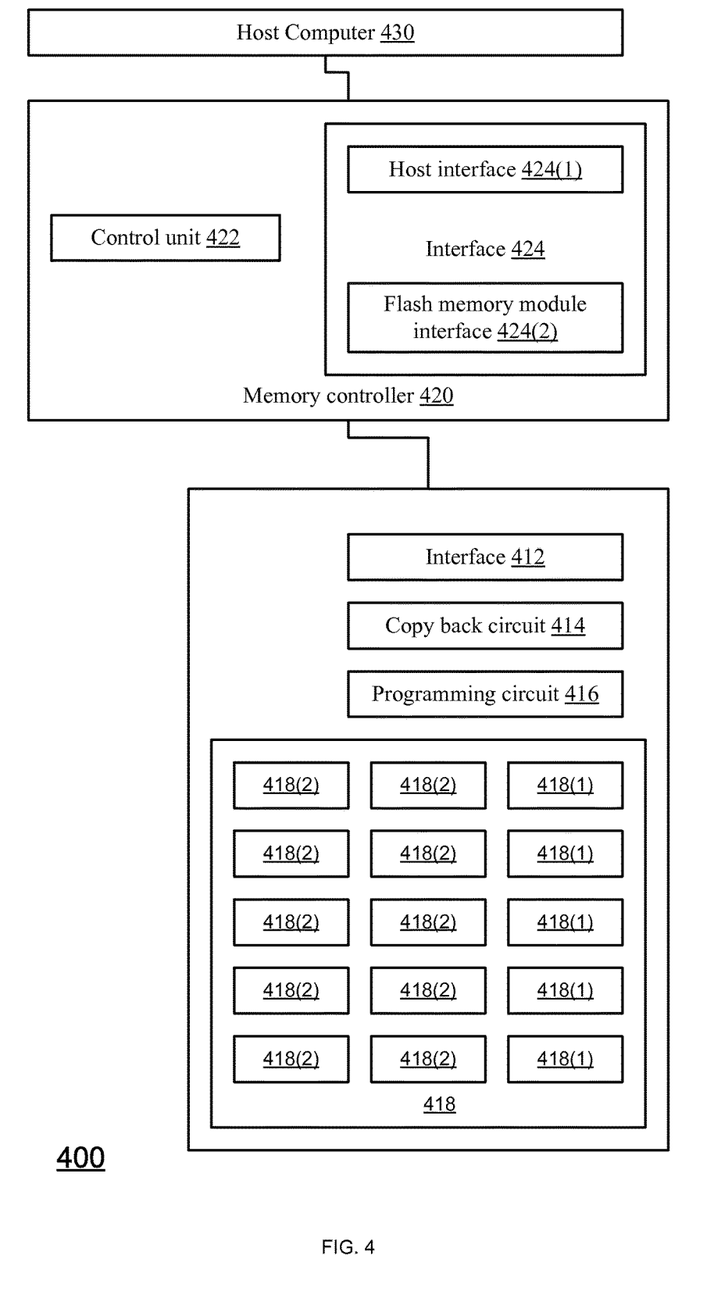
FIG. 4 illustrates a system according to an embodiment of the invention.

FIG. 4 illustrates a flash memory module 410, a memory controller 420 and a host computer 430 according to an embodiment of the invention.

The memory controller 420 includes a control unit 422 and an interface 424. The interface may include a host interface 424(1) and a flash memory module interface 424(2).

The interface 424 is arranged to receive multiple input data units from a host computer. The input data units comprises first and second input data units.

The control unit 422 is arranged to (a) instruct a programming circuit of a flash memory module to perform first level programming the first input data units to cache memory pages of the flash memory module and to perform first level programming of the second input data units to first level target memory pages of the flash memory module; and (b) instruct a copy back circuit of the flash memory module to apply a copy back operation that comprises retrieving the first input data units from the cache memory pages and second level programming the first input data units to second level target memory pages. Any target page (out of the first level target pages and the second level target pages) differs from a cache memory page. The first level programming is faster than the second level programming.

Flash memory module 410 includes interface 412, a copy back circuit 414, a programming circuit 416, and flash memory pages 418.

The flash memory pages 418 may include flash memory pages that at a certain point in time are cache memory pages (such as 418(1)) and may include flash memory pages that at the certain point in time are non-cache memory pages and may be target memory pages (such as 418(2)). The allocation may be fixed or change over time.

The interface 412 is arranged to receive multiple input data units from a memory controller; wherein the input data units comprises first and second input data units.

The programming circuit 416 is arranged to perform first level programming the first input data units to cache memory pages of the flash memory module and to perform first level programming of the second input data units to first level target memory pages of the flash memory module.

The copy back circuit 414 is arranged to apply a copy back operation that comprises retrieving the first input data units from the cache memory pages and second level programming the first input data units to second level target memory pages. Any target page out of the first level target pages and the second level target pages may differ from a cache memory page. The first level programming is faster than the second level programming.

Figure 5:
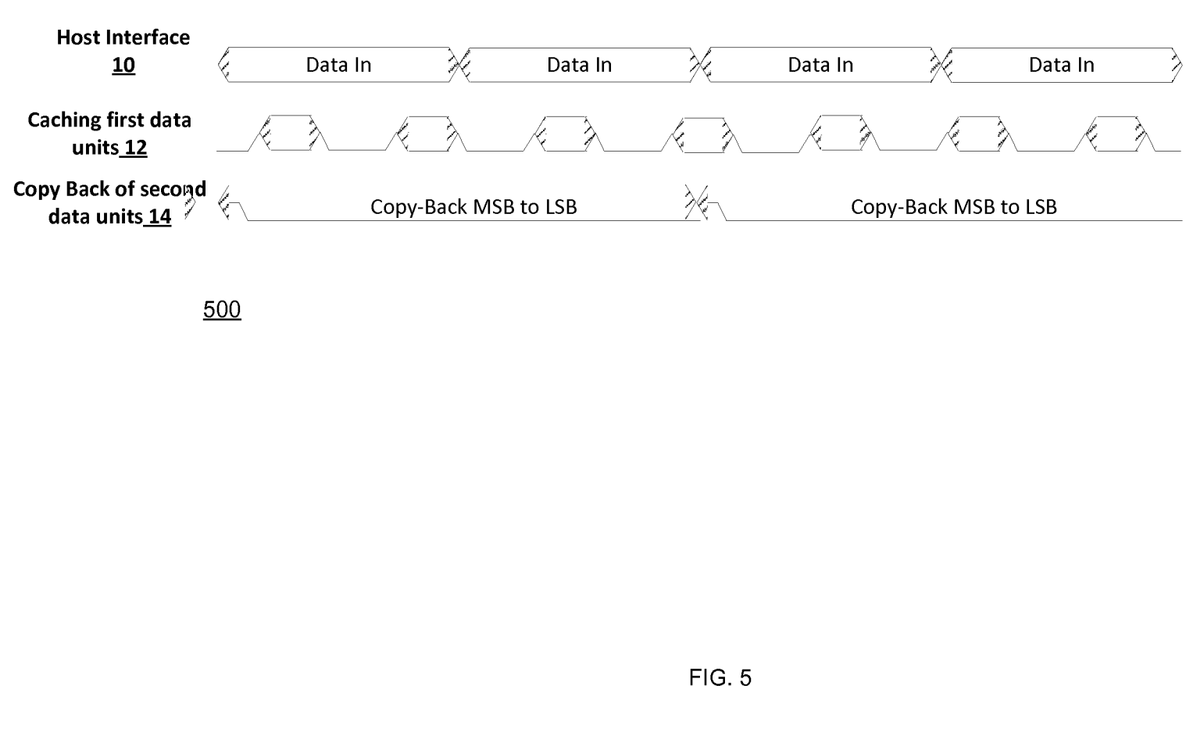
FIG. 5 is a timing diagram according to an embodiment of the invention.

FIG. 5 is a timing diagram 500 according to an embodiment of the invention. The timing diagram 500 shows (a) data being written 10 by a host computer to a host interface of a memory controller, (b) first data units being written 12 to cache memory pages, and (c) data being copied back 14 to second level target pages.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for accelerating programming of data, comprising:
   receiving multiple input data units that were sent from a host computer; wherein the input data units comprise first and second input data units;
   most significant bit (MSB) programming the first input data units to cache memory pages and MSB programming the second input data units to first level target memory pages; and
   applying a copy back operation that comprises retrieving the first input data units from the cache memory pages and least significant bit (LSB) programming the retrieved first input data units to second level target memory pages;
   wherein any target page out of the first level target memory pages and the second level target memory pages differs from a cache memory page;
   wherein the MSB programming is faster than the LSB programming;
   wherein the input data units further comprise third input data units;
   wherein the method further comprises MSB programming the third input data units to additional cache memory pages;
   wherein the applying of the copy back operation further comprises retrieving the third input data units from the additional cache memory pages and third level programming the third input data units to third level target memory pages; and
   wherein the third level programming differs by speed from the MSB and LSB programming.

2. The method according to claim 1, wherein the MSB programming of the first and second input data units occur in parallel to each other.

3. The method according to claim 1, wherein the MSB programming of the first and second input data units occur in a partially overlapping manner.

4. The method according to claim 1, further comprising preventing further programming of any input data unit after the input data unit is programmed to a target page.

5. The method according to claim 1, wherein a ratio between an overall number of dies performing Copy Back and an overall number of dies caching exceeds one.

6. The method according to claim 1, wherein a ratio between an overall number of dies performing Caching and an overall size of dies performing Copy Back is a fraction of a ratio between programming speeds of the MSB and the LSB programming.

7. The method according to claim 6, wherein the fraction is one half.

8. The method according to claim 1, wherein the cache memory pages and the first level target pages are MSB pages.

9. The method according to claim 8, wherein the second level target pages are LSB pages.

10. The method according to claim 9, wherein the MSB programming of the first and second input data units occur in parallel to each other.

11. The method according to claim 9, wherein the MSB programming of the second input data units and the first input data units occur in a partially overlapping manner.

12. The method according to claim 1, wherein the receiving the multiple input data units from the host computer includes continuously receiving additional ones of the multiple input data units while MSB programming the first input data units.

13. A method for accelerating programming of data, comprising:
   receiving multiple input data units by a memory controller and from a host computer;
   wherein the input data units comprises first and second input data units;
   instructing a programming circuit of a flash memory module to perform most significant bit (MSB) programming the first input data units to cache memory pages of the flash memory module and to perform MSB programming the second input data units to first level target memory pages of the flash memory module; and instructing a copy back circuit of the flash memory module to apply a copy back operation that comprises retrieving the first input data units from the cache memory pages and least significant bit (LSB) programming the retrieved first input data units to second level target memory pages;

wherein any target page out of the first level target memory pages and the second level target memory pages differs from a cache memory page;

wherein the MSB programming is faster than the LSB programming;

wherein the input data units further comprise third input data units;

wherein the method further comprises MSB programming the third input data units to additional cache memory pages;

wherein the applying of the copy back operation further comprises retrieving the third input data units from the additional cache memory pages and third level programming the third input data units to third level target memory pages; and wherein the third level programming differs by speed from the MSB and LSB programming.

14. The method according to claim 13, further comprising allocating cache memory pages and target pages.

15. The method according to claim 14, wherein the allocating is responsive to programming speeds of the MSB and LSB programming.

16. The method according to claim 13, wherein the cache memory pages and the first level target pages are MSB pages, and wherein the second level target pages are LSB pages.

17. A non-transitory computer readable medium that stores instructions that once executed by a computer causes the computer to execute the stages of:
  receiving multiple input data units that were sent from a host computer; wherein the input data units comprises first and second input data units;
  most significant bit (MSB) programming the first input data units to cache memory MSB pages and MSB programming the second input data units to MSB target memory pages; and
  applying a copy back operation that comprises retrieving the first input data units from the cache memory MSB pages and least significant bit (LSB) programming the retrieved first input data units to LSB target memory pages;
  wherein any target page out of the MSB target memory pages and the LSB target memory pages differs from a cache memory MSB page;
  wherein the MSB programming is faster than the LSB programming; and
  wherein a ratio between an overall number of dies performing the caching and an overall size of dies performing the copy back operation is a fraction of a ratio between programming speeds of the MSB and the LSB programming.

18. A memory controller, comprising;
a control unit; and
an interface;
wherein the interface is arranged to receive multiple input data units from a host computer;
wherein the input data units comprises first and second input data units; wherein the control unit is arranged to:
  instruct a programming circuit of a flash memory module to perform most significant bit (MSB) programming the first input data units to cache memory pages of the flash memory module and to perform MSB programming of the second input data units to first level target memory pages of the flash memory module; and
  instruct a copy back circuit of the flash memory module to apply a copy back operation that comprises retrieving the first input data units from the cache memory pages and least significant bit (LSB) programming the retrieved first input data units to second level target memory pages;
wherein any target page out of the first level target memory pages and the second level target memory pages differs from a cache memory page;
wherein the MSB programming is faster than the LSB programming; and
wherein a ratio between an overall number of dies performing the copy back operation and an overall number of dies caching exceeds one.

19. The memory controller according to claim 18, wherein the cache memory pages and the first level target pages are MSB pages, and wherein the second level target pages are LSB pages.

20. A flash memory module, comprising:
an interface;
a copy back circuit;
a programming circuit; and
flash memory pages;
  wherein the interface is arranged to receive multiple input data units from a memory controller; wherein the input data units comprise first and second input data units;
  wherein the programming circuit is arranged to perform most significant bit (MSB) programming the first input data units to cache memory pages of the flash memory module and to perform MSB programming of the second input data units to first level target memory pages of the flash memory module; and
  wherein the copy back circuit is arranged to apply a copy back operation that comprises retrieving the first input data units from the cache memory pages and least significant bit (LSB) programming the retrieved first input data units to second level target memory pages;
  wherein any target page out of the first level target memory pages and the second level target memory pages differs from a cache memory page;
  wherein the MSB programming is faster than the LSB programming; and
  wherein a ratio between an overall number of dies performing the copy back operation and an overall number of dies caching exceeds one.

* * * * *